US009429622B2

(12) United States Patent (10) Patent No.: US 9,429,622 B2
Douskey et al. (45) Date of Patent: *Aug. 30, 2016

(54) IMPLEMENTING ENHANCED SCAN CHAIN DIAGNOSTICS VIA BYPASS MULTIPLEXING STRUCTURE

(71) Applicant: International Business Machines Corporation, Armonk, NY (US)

(72) Inventors: Steven M. Douskey, Rochester, MN (US); Michael J. Hamilton, Rochester, MN (US); Amanda R. Kaufer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/697,032

(22) Filed: Apr. 27, 2015

(65) Prior Publication Data

US 2016/0216324 A1    Jul. 28, 2016

Related U.S. Application Data

(63) Continuation of application No. 14/606,145, filed on Jan. 27, 2015.

(51) Int. Cl.
*G01R 31/28* (2006.01)
*G01R 31/3177* (2006.01)

(52) U.S. Cl.
CPC ............................. *G01R 31/3177* (2013.01)

(58) Field of Classification Search
CPC ............... G01R 31/31709; G01R 31/318552; G01R 31/3177; G06F 1/08; H03L 7/00; H03K 5/1252; H03K 5/135; H03K 5/12
See application file for complete search history.

(56) References Cited

U.S. PATENT DOCUMENTS

| | | | |
|---|---|---|---|
| 5,615,217 A | 3/1997 | Horne et al. | |
| 5,925,143 A | 7/1999 | Gillis et al. | |
| 5,949,272 A | 9/1999 | Bickford et al. | |
| 6,158,032 A * | 12/2000 | Currier | G01R 31/318536 324/73.1 |
| 6,314,539 B1 | 11/2001 | Jacobson et al. | |
| 6,988,230 B2 | 1/2006 | Vermeulen et al. | |
| 7,774,662 B2 * | 8/2010 | Motika | G01R 31/318547 714/726 |
| 7,996,738 B2 * | 8/2011 | Gemmeke | G01R 31/318575 714/726 |
| 8,479,067 B2 | 7/2013 | Chandra et al. | |
| 2002/0144168 A1 * | 10/2002 | Bleakley | G01R 31/31709 713/400 |
| 2004/0268195 A1 * | 12/2004 | Eustis | G01R 31/31855 714/726 |
| 2005/0172188 A1 * | 8/2005 | Burdine | G01R 31/318544 714/726 |

(Continued)

OTHER PUBLICATIONS

Appendix P—List of IBM Patents or Patent Applications Treated As Related—May 8, 2015.

*Primary Examiner* — Guerrier Merant
(74) *Attorney, Agent, or Firm* — Joan Pennington

(57) ABSTRACT

A method and system for implementing enhanced scan chain diagnostics via a bypass multiplexing structure. A full scan chain structure is partitioned into a plurality of separate chains, such as three separate partitioned chains, with bypass multiplexers for implementing enhanced scan chain diagnostics. Each of the separate partitioned chains includes bypass multiplexers with independent controls enabling scan data being routed through multiple different independent scan paths, potentially bypassing failing latches. The information acquired from a combination of full scans and partitioned scans is used for scan failure isolation to enable pinpoint identification of stuck-at-zero (SA0) and stuck-at-one (SA1) faults in the scan chain.

7 Claims, 9 Drawing Sheets

(56) References Cited

U.S. PATENT DOCUMENTS

| | | | |
|---|---|---|---|
| 2006/0129900 A1* | 6/2006 | Clark | G01R 31/318575 714/726 |
| 2007/0011523 A1* | 1/2007 | Burdine | G06F 11/2215 714/726 |
| 2009/0210763 A1* | 8/2009 | Eckelman | G01R 31/318544 714/731 |
| 2009/0217116 A1* | 8/2009 | Motika | G01R 31/318541 714/729 |
| 2013/0185607 A1 | 7/2013 | Tekumalla et al. | |
| 2013/0185608 A1 | 7/2013 | Bhawmik | |
| 2014/0143623 A1* | 5/2014 | Touba | G01R 31/318547 714/728 |
| 2015/0082108 A1* | 3/2015 | Goel | G01R 31/318588 714/726 |

* cited by examiner

IMPLEMENTING ENHANCED SCAN CHAIN DIAGNOSTICS VIA BYPASS MULTIPLEXING STRUCTURE

This application is a continuation application of Ser. No. 14/606,145 filed Jan. 27, 2015.

FIELD OF THE INVENTION

The present invention relates generally to the data processing field, and more particularly, relates to a method and system for implementing enhanced scan chain diagnostics via a bypass multiplexing structure.

DESCRIPTION OF THE RELATED ART

Scan chains are the foundation of integrated circuit testing. Therefore, the ability to diagnosis scan chain fails is important.

A common implementation for scan chain diagnostics includes Exclusive-or (XOR) books periodically inserted in the scan path to inject values beyond failing locations. This method only detects the fail closest to the scan out pin and results in large amounts of fail data, as every location before the fail location will be logged as a fail.

A need exists for an effective new method and structure to diagnosis scan chain fails. It is desirable to provide such method for implementing diagnostics of multiple fails leading to fabrication process and design changes that improve later yield and reduce waste.

SUMMARY OF THE INVENTION

Principal aspects of the present invention are to provide a method and system for implementing enhanced scan chain diagnostics via a bypass multiplexing structure. Other important aspects of the present invention are to provide such method and system substantially without negative effects and that overcome some of the disadvantages of prior art arrangements.

In brief, a method and system for implementing enhanced scan chain diagnostics via a bypass multiplexing structure. A full scan chain having a scan input to a scan output is partitioned into a plurality of separate partitioned chains with the bypass multiplexer structure for implementing enhanced scan chain diagnostics. Each of the separate partitioned chains includes bypass multiplexers with independent controls enabling scan data being routed from the scan input to the scan output through multiple different independent scan paths, potentially bypassing failing latches. Information acquired from a combination of full scans and separate partitioned scans is used for scan failure isolation, to enable pinpoint identification of stuck-at-zero (SA0) and stuck-at-one (SA1) faults in the scan chain.

In accordance with features of the invention, each bypass multiplexer for the separate partitioned chains has an independent select, for example with three separate partitioned chains three separate wires or the result of a decode of two wires. Each of the separate partitioned chains has a unique path from the scan input to the scan output.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and system are provided for implementing enhanced scan chain diagnostics via a bypass multiplexing structure in accordance with the preferred embodiment.

Figure 1:
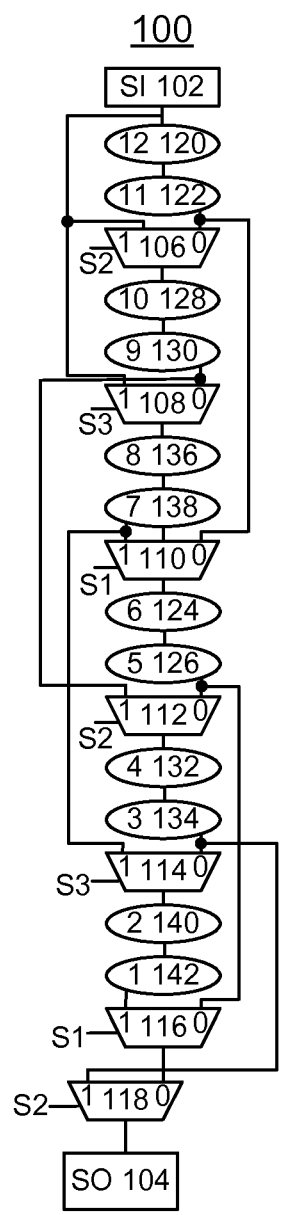
FIG. 1 illustrates an example full scan chain bypass multiplexing structure partitioned into a plurality of separate partitioned chains, such as three partitioned chains as shown, with bypass multiplexers for implementing enhanced scan chain diagnostics in accordance with preferred embodiments.

Having reference now to the drawings, in FIG. 1, there is shown an example bypass multiplexing structure generally designated by the reference character 100 in accordance with the preferred embodiment. The bypass multiplexing structure 100 includes a full scan chain 100 extending between a scan input (SI) 102 and a scan output (SO) 104. As shown, the bypass multiplexing structure full scan chain 100 is partitioned into a plurality of separate chains with the bypass multiplexer structure with a plurality of bypass multiplexers 106, 108, 112, 114, 116, and 118 for implementing enhanced scan chain diagnostics. Each of the bypass multiplexers 106, 108, 112, 114, 116, and 118 has independent controls enabling scan data being routed from the scan input SI, 102 to the scan output SO, 104 through multiple different independent scan paths, potentially bypassing failing latches.

In accordance with features of the invention, information acquired from a combination of full scans and separate partitioned scans is used for scan failure isolation, to enable pinpoint identification of stuck-at-zero (SA0) and stuck-at-one (SA1) faults in the scan chain.

A first separate partitioned scan chain includes scan block 120, 122, bits 12, 11, multiplexer 110, scan blocks 124, 126, bits 6, 5, and multiplexers 116, 118. A second separate partitioned scan chain includes multiplexer 106, scan blocks 128, 130, bits 10, 9, multiplexer 112, scan blocks 132, 134, bits 4, 3, and multiplexer 118. A third separate partitioned scan chain includes multiplexer 108, scan blocks 136, 138, bits 8, 7, multiplexer 114, scan blocks 140, 142, bits 2, 1, and multiplexers 116, 118. Multiplexer 118 couples each of the first, second and third separate partitioned scan chains to the scan output SO, 104.

In accordance with features of the invention, each bypass multiplexer for the separate partitioned chains has an independent select, for example with three separate partitioned chains three independent select S1, S2, and S3, defining separate partitioned scan chain paths shown in FIG. 1. The three independent select S1, S2, and S3 optionally are provided with three separate wires or the result of a decoder with two wires (not shown). Each of the first, second and third separate partitioned chains provides a unique path from the scan input to the scan output.

Figure 2:
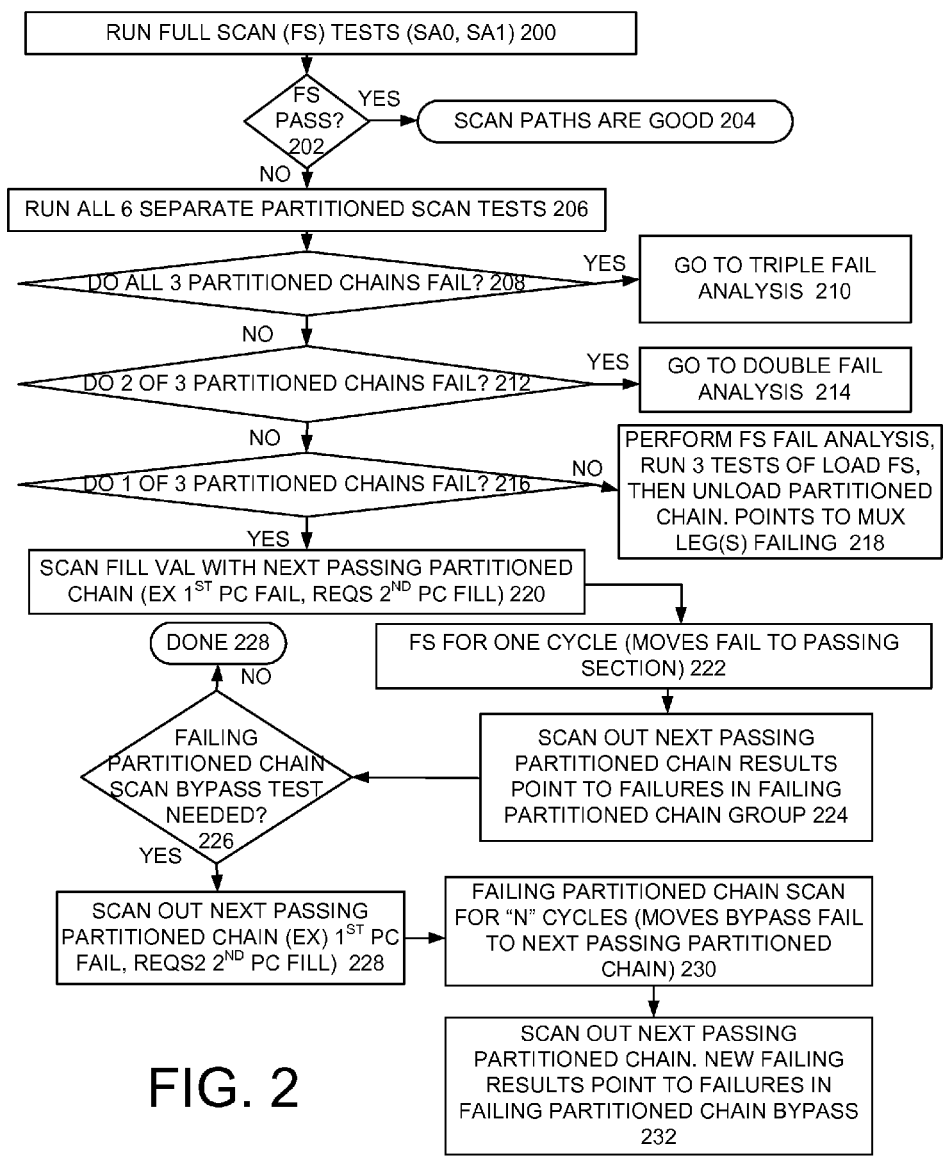
FIG. 2 illustrates example operations for the full scan chain and the three partitioned chains provided by the bypass multiplexing structure for implementing enhanced scan chain diagnostics used to diagnose a scan chain fail in accordance with preferred embodiments.
Figure 6:
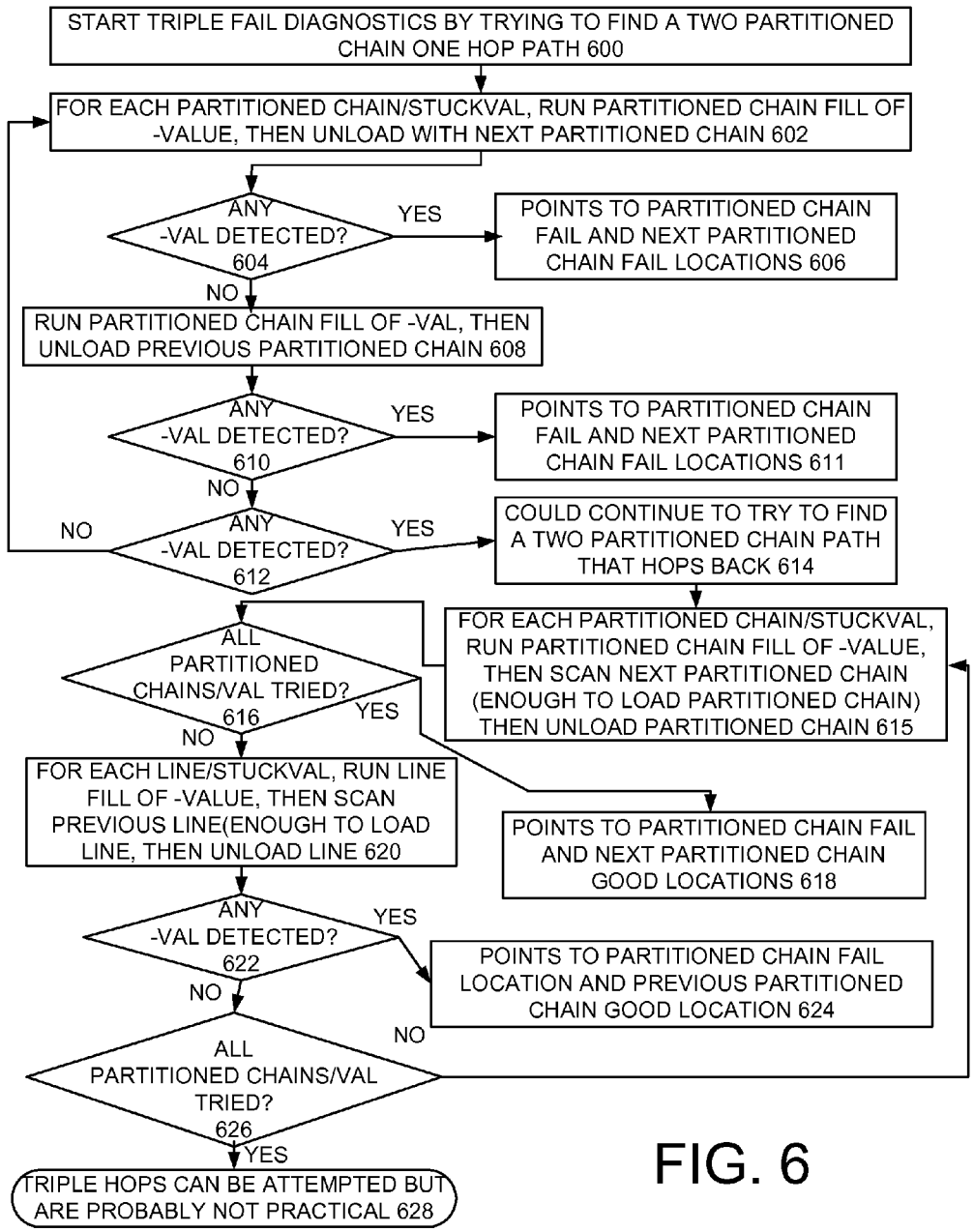
FIG. 6 illustrates further example operations for the full scan chain and the three colored chains provided by the bypass multiplexers used to diagnose a scan chain triple fail in accordance with preferred embodiments.
Figure 7:
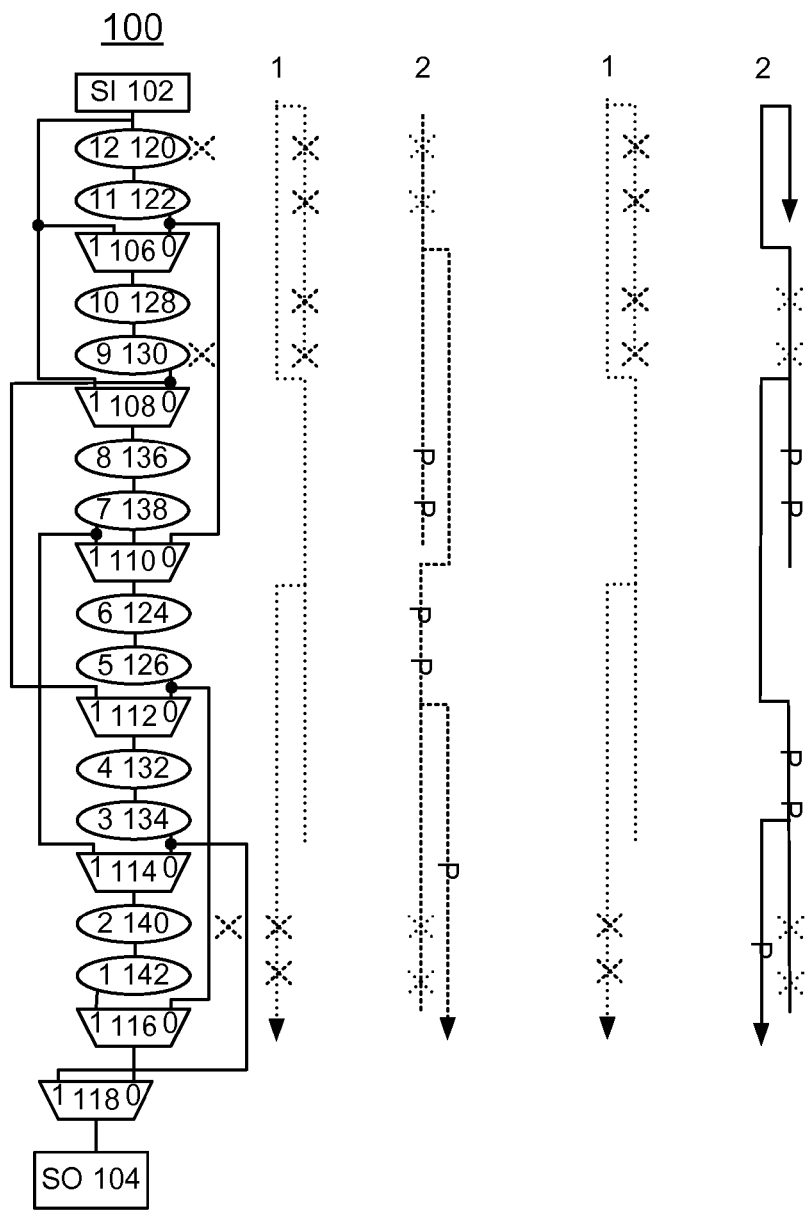
FIG. 7 illustrates the example full scan chain structure of FIG. 1 with an example double fail bits with scan chain results of multiple test scans for the example triple fail analysis in accordance with preferred embodiments.

Referring now to FIG. 2, there are shown example operations with the full scan chain and the three partitioned chains provided by the bypass multiplexing structure 100 for implementing enhanced scan chain diagnostics used to diagnose a scan chain fail in accordance with preferred embodiments. Diagnostics begin with running full scan (FS) tests including stuck-at-zero (SA0) and stuck-at-one (SA1) full scan tests as indicated in a block 200. Checking for full scan passing results is performed as indicated in a decision block 202. With full scan passing results, the scan paths are good and the operations are completed as indicated in a block 204. With a fail in the full scan results, then six separate partitioned scan tests including stuck-at-zero (SA0) and stuck-at-one (SA1) scan tests for each of the first, second and third separate partitioned chains as indicated in a block 206. Checking if all of first, second and third separate partitioned chains fail is performed as indicated in a decision block 208. With at least one fail in all of first, second and third separate partitioned chains, then a triple fail analysis is performed as indicated in a block 210. For example, an example triple fail analysis is illustrated in FIGS. 6 and 7.

Checking if two of the three first, second and third separate partitioned chains fail is performed as indicated in a decision block 212. With a fail in two of the three first, second and third separate partitioned chains, then a double fail analysis is performed as indicated in a block 214. For example, an example double fail analysis is illustrated in FIGS. 4 and 5.

Checking if one of the three first, second and third separate partitioned chains fail is performed as indicated in a decision block 216. When a fail in one of the three first, second and third separate partitioned chains is not identified, then a full scan fail analysis it performed, for example, running 3 tests of load full scan, then unload partitioned for each third separate partitioned chain, points to leg or legs of failing multiplexer as indicated in a block 218. With a fail in one of the three first, second and third separate partitioned chains, then a single fail analysis is performed with scan fill value of next passing partitioned chain as indicated in a block 220. For example, with an identified first partitioned chain fail, requests second partitioned chain fill as shown at block 220. A full scan for one cycle is performed as indicated in a block 222, for example, moving fail to passing section. As indicated in a block 224, a scan out of next passing partitioned chain results point to failures in failing partitioned chain group. Checking is performed to determine if failing partitioned chain scan bypass test is needed as indicated in a decision block 226. If not the operations are completed as indicated in a block 228. If the failing partitioned chain scan bypass test is needed, then scan out the next passing partitioned chain as indicated in a block 230. For example, with an identified first partitioned chain fail, requests next or second partitioned chain fill as shown at block 230. As indicated in a block 232, a scan out of next passing partitioned chain results point to failures in failing partitioned chain group.

Figure 3:
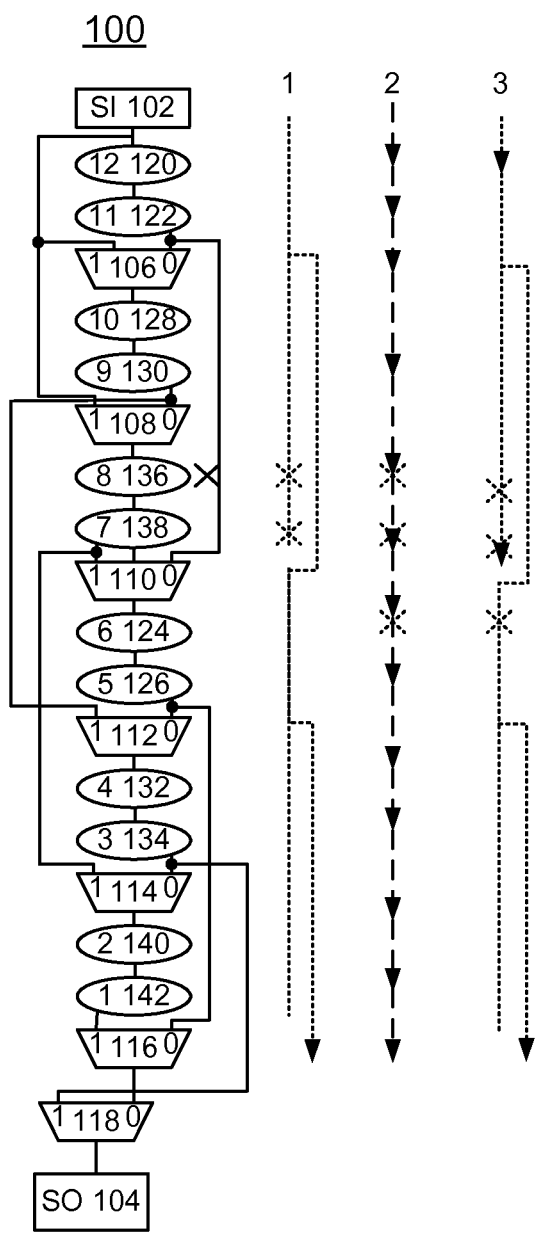
FIG. 3 illustrates the example full scan chain structure of FIG. 1 with an example fail bit with scan chain results of multiple test scans for the example single fail analysis in accordance with preferred embodiments.

Referring also to FIG. 3, the example full scan chain structure 100 of FIG. 1 with fail with scan chain results of multiple test scans for the example single fail analysis in accordance with preferred embodiments. As shown, an example fail bit 8 in the third partitioned chain is identified. A next passing partitioned chain or first partitioned chain scan is shown at line 1 that loads 1 every where but at fail. A full scan as indicated in a line 2 moves the fail area to the next or first partitioned chain. A next first partitioned chain scan is shown at line 3 that pulls out bit 6 change, which points to SA0 at Bit 7 or 8.

Figure 4:
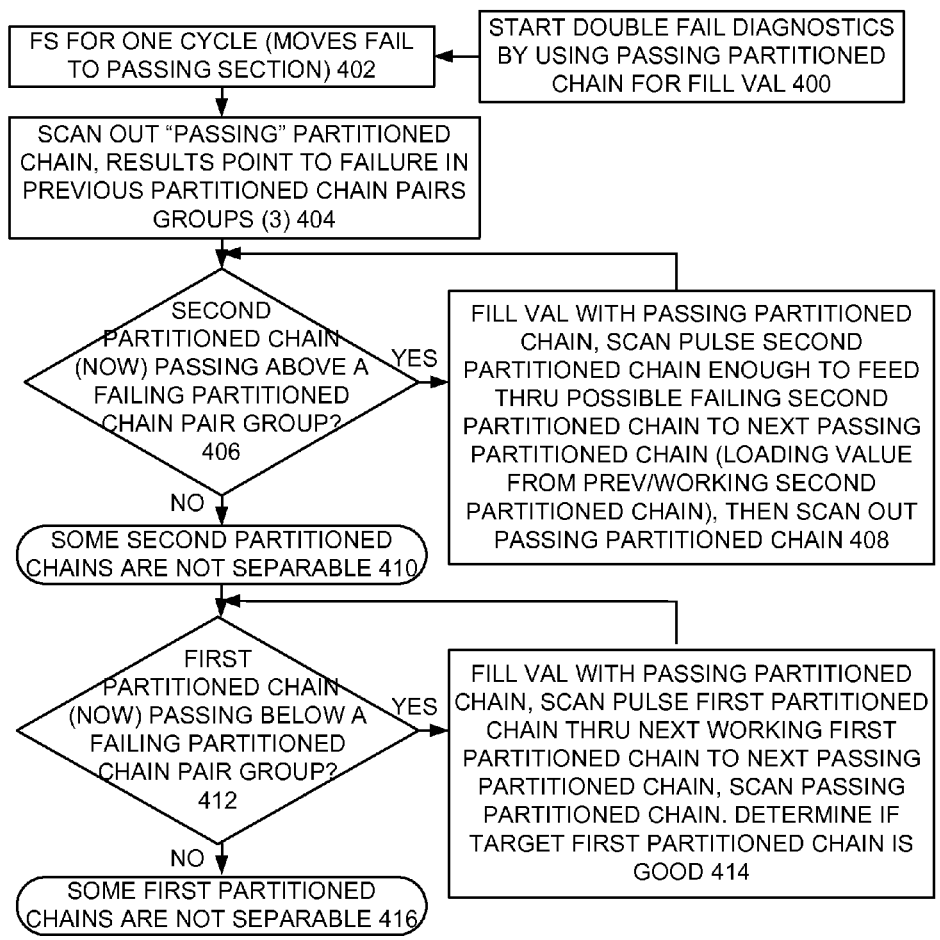
FIG. 4 illustrates further example operations for the full scan chain and the three partitioned chains provided by the bypass multiplexers used to diagnose a scan chain double fail in accordance with preferred embodiments.
Figure 5:
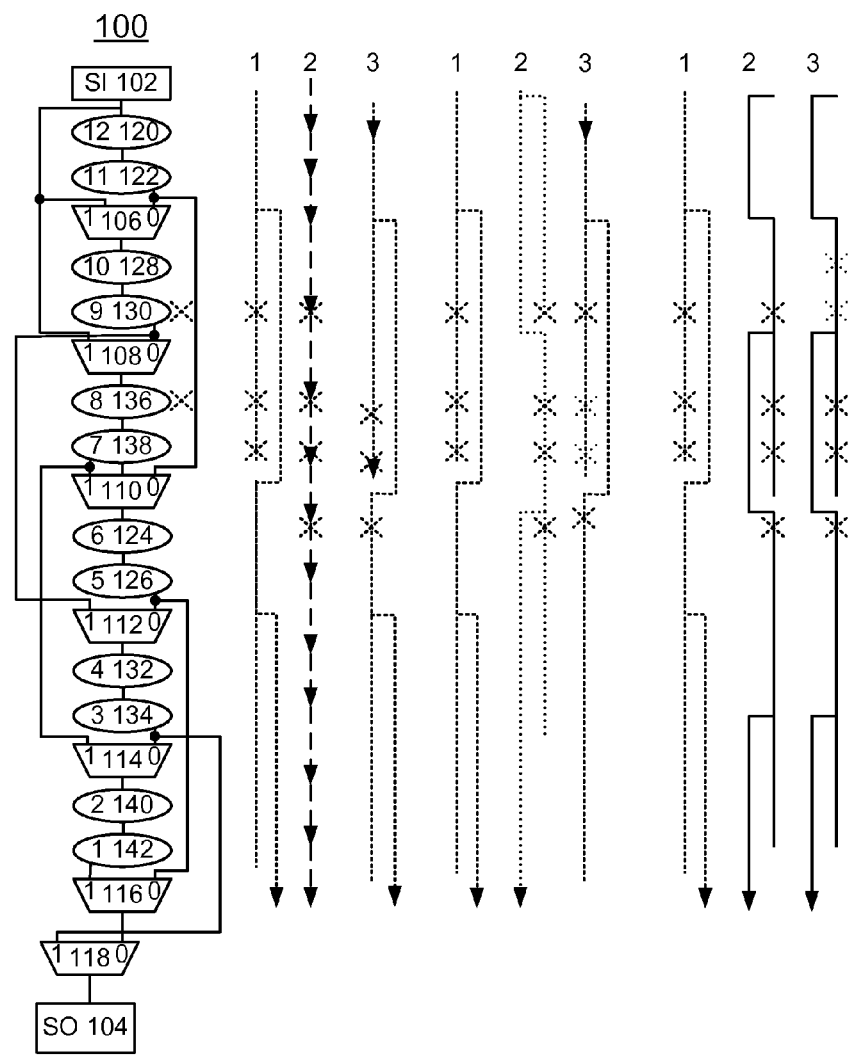
FIG. 5 illustrates the example full scan chain structure of FIG. 1 with an example double fail bits with scan chain results of multiple test scans for the example double fail analysis in accordance with preferred embodiments.

Referring now to FIG. 4, there are shown further example operations for the full scan chain and the three partitioned chains provided by the bypass multiplexing structure 100 to diagnose a scan chain double fail in accordance with preferred embodiments. The double fail diagnostics start by using the passing partitioned chain for fill value as indicated in a block 400. A full scan for one cycle is performed, moving fail to passing section as indicated in a block 402. Next a scan out of passing partitioned chain, results point to failure in previous partitioned chain pairs groups as indicated in a block 404. Checking if second partitioned chain now passing above a failing partitioned chain pair group is performed as indicated in a decision block 406. As indicated in a block 408, with second partitioned chain now passing above a failing partitioned chain pair group, then fill value with passing partitioned chain, scan pulse second partitioned chain enough to feed through possible failing second partitioned chain to next passing partitioned chain (loading value from previous/working second partitioned chain), then scan out passing partitioned chain, and return to decision block 406. Otherwise, some second partitioned chains are not separable as indicated in a block 410.

Checking if first partitioned chain now passing below a failing partitioned chain pair group is performed as indicated in a decision block 412. As indicated in a block 414, with the first partitioned chain now passing below a failing partitioned chain pair group, then fill value with passing partitioned chain, scan pulse first partitioned chain enough to feed through to next passing partitioned chain, then scan out passing partitioned chain, and determine if target first partitioned chain is good, and return to decision block 412. Otherwise, some first partitioned chains are not separable as indicated in a block 416.

Referring also to FIG. 5 illustrates the example full scan chain structure 100 with an example double fail bits with scan chain results of multiple test scans for the example double fail analysis in accordance with preferred embodiments. As shown, an example fail bit 9 in the second partitioned chain and an example fail bit 8 in the third partitioned chain are identified in the full scan chain structure 100. As shown at a first line 1, the first partitioned chain scan loads 1 everywhere but failing second and third partitioned chain pair. As shown at a first line 2, full scan moves fail to working first partitioned chain, also proving bits 1-6 are working. As shown at first line 3, scan moves show fails in partitioned chain bits 7-10. As shown at middle lines 1, and 2, the first partitioned chain scan fail is in partitioned chain pair Bit 7-10, and loads 1 everywhere but failing third partitioned chain, then moves third partitioned chain to working area, then scan out working area showing SA0 at Bit 7 or 8. As shown at third lines 1, 2, and 3, the first partitioned chain scan loads 1 everywhere but failing second partitioned chain, then moves first partitioned chain from working area thru third partitioned chain failing area to third partitioned chain working area, then scan out working area showing SA0 at Bit 9 or 10. The first fail of the two is isolated in 10 tests and both fails are isolated in 11 tests. The unload partitioned chain at line middle lines 1, 2, 3 may vary depending on whether or not part of a working partitioned chain is below a working section of a failing partitioned chain. In this example, there was no first partitioned chain below the working bits 3 and 4 in the second partitioned chain, so a second partitioned chain unload was used in lieu of a first partitioned chain unload. More fails in adjacent partitioned chains can limit diagnostics.

Referring now to FIG. 6, there are shown further example operations for the full scan chain and the three partitioned chains provided by the bypass multiplexer structure 100 used to diagnose a scan chain triple fail in accordance with preferred embodiments. As indicated in a block 600, the triple fail diagnostics start by trying to find a two partitioned chain one hop path. For each partitioned chain/stuckval, run partitioned chain fill of –value, then unload with next partitioned chain as indicated in a block 602. Checking for any –value detected is performed as indicated in a decision block 604. If any –value detected, points to partitioned chain fail and next partitioned chain fail locations as indicated in a block 606. Otherwise run partitioned chain fill of –value, then unload previous partitioned chain as indicated in a block 608. Checking for any –value detected is performed as indicated in a decision block 610. If any –value detected, points to partitioned chain fail and next partitioned chain fail locations as indicated in a block 611. Otherwise, checking for all partitioned chains/values tried as indicated in a decision block 612. If all tried could continue to try to find a two partitioned chain path that hops back as indicated in a block 614. Otherwise, if any –value is not detected, return to block 602 and continue as before.

As indicated in a block 614, for each partitioned chain/stuckval, run partitioned chain fill of –value, then scan next partitioned chain enough to load the partitioned chain then unload the partitioned chain as indicated in a block 615. Checking for any –value detected is performed as indicated in a decision block 616. If any detected, points to partitioned chain fail and next partitioned chain fail locations as indicated in a block 618. Otherwise for each line and stuck values, run a fill of –value, then scan pervious line enough to load the line, then unload the line in block 620. Checking as indicated in a decision block 622. If any detected, points to partitioned chain fail and previous partitioned chain fail locations as indicated in a block 624. Otherwise checking for all partitioned chains/values tried is performed as indicated in a decision block 626. Otherwise, return to block 614 and continue as before. As indicated in a block 628, triple hops can be attempted but are probably not practical.

Referring now to FIG. 7 illustrates the example full scan chain structure 100 with an example triple fail bits with scan chain results of multiple test scans for the example triple fail analysis in accordance with preferred embodiments. As shown, an example fail bit 12 in the first partitioned chain, an example fail bit 9 in the second partitioned chain and an example fail bit 2 in the third partitioned chain are identified in the full scan chain structure 100. As shown at first lines 1, 2, a third partitioned chain, and first partitioned chain scan shows SA0 at Bit 11 or 12; SA0 at Bit 1 or 2, Bits 5-8 good. As shown at second lines 1, 2, a third partitioned chain, and second partitioned chain scan shows SA0 at Bit 9 or 10; Bits 3-4 good. The three fails are isolated with twelve tests.

Once a double partitioned chain hop is found to work other fails below the loading partitioned chain detect fail and above the unloading partitioned chain detected fail can also be found. Note that fails on bypass paths will not be detected in the full scan, but act as any other fail when looking at partitioned chain paths. Note that fails at the beginning and end of the scan chain can require a slightly different method, but can also be separable and diagnosable.

Figure 8:
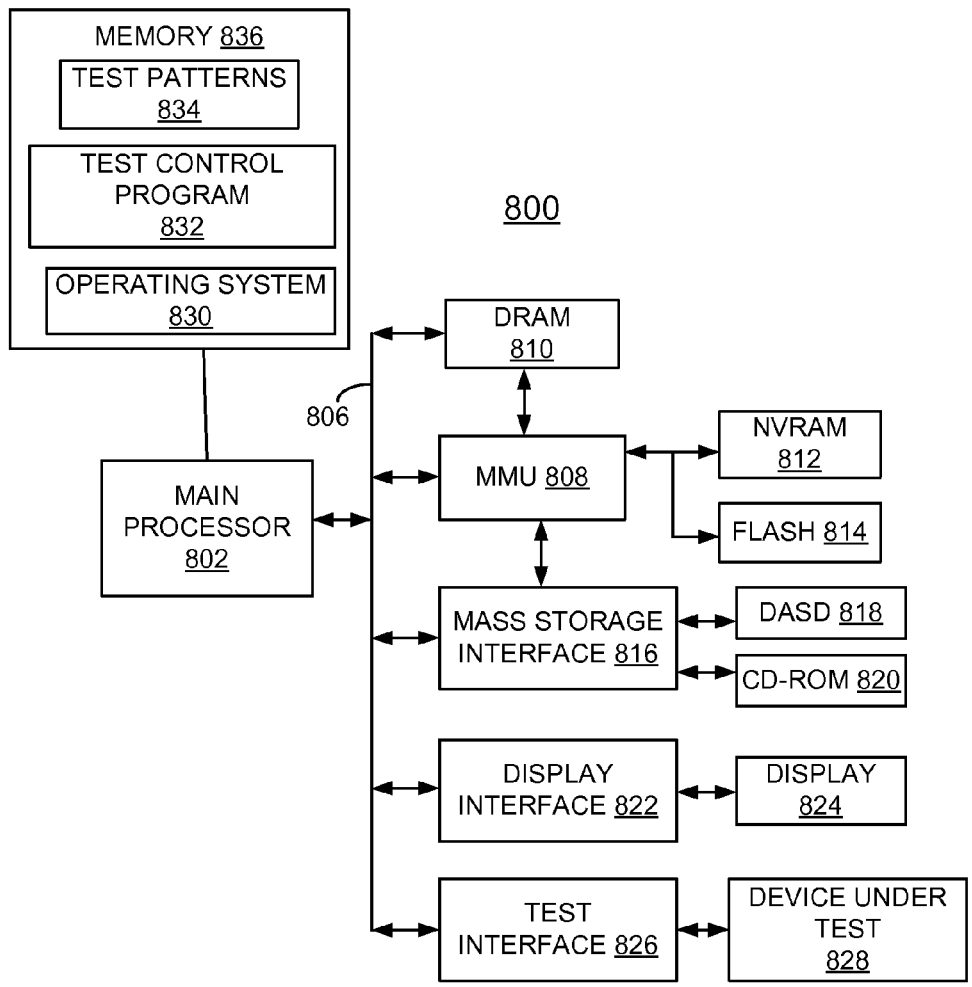
FIG. 8 is a block diagram representation illustrating an example computer system and operating system for implementing enhanced scan chain diagnostics in accordance with the preferred embodiment.

In FIG. 8, there is shown an exemplary computer test system generally designated by the reference character 800 for implementing scan chain diagnostics in accordance with the preferred embodiment. Computer system 800 includes a main processor 802 or central processor unit (CPU) 802 coupled by a system bus 806 to a memory management unit (MMU) 808 and system memory including a dynamic random access memory (DRAM) 880, a nonvolatile random access memory (NVRAM) 812, and a flash memory 814. A mass storage interface 816 coupled to the system bus 806 and MMU 808 connects a direct access storage device (DASD) 818 and a CD-ROM drive 820 to the main processor 802. Computer system 800 includes a display interface 822 connected to a display 824, and a test interface 826 coupled to the system bus 806. A device under test 828 is coupled to the test interface 826. The device under test 828 includes, for example, an integrated circuit wafer, a module, or a system. Computer system 800 includes an operating system 830, a test control program 832 tangibly embodied on a non-transitory computer readable storage medium including program means or program instructions for carrying out the methods for implementing scan chain diagnostics via a bypass multiplexing structure, and a set of test patterns 834 of the preferred embodiment resident in a memory 836.

Computer test system 800 is shown in simplified form sufficient for understanding the present invention. The illustrated computer test system 800 is not intended to imply architectural or functional limitations. The present invention can be used with various hardware implementations and systems and various other internal hardware devices, for example, multiple main processors.

Figure 9:
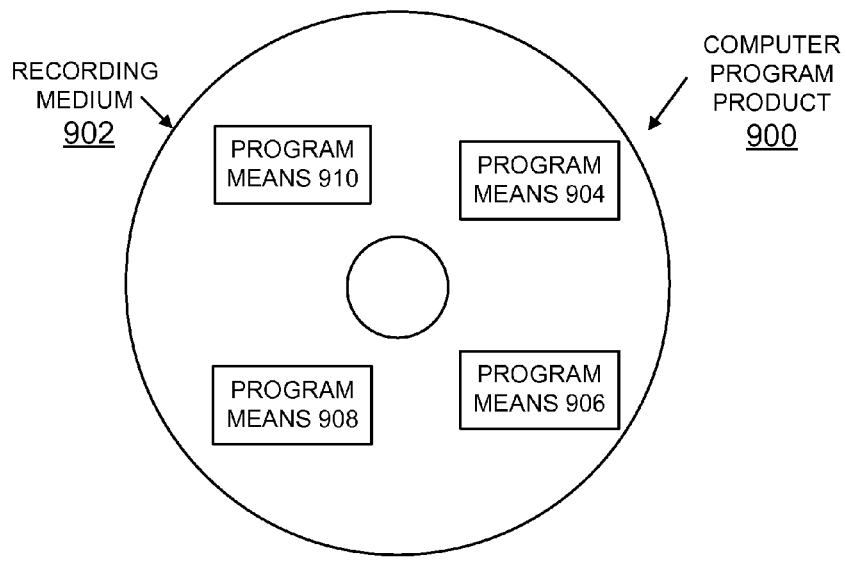
FIG. 9 is a block diagram illustrating a computer program product in accordance with the preferred embodiment.

Referring now to FIG. 9, an article of manufacture or a computer program product 900 of the invention is illustrated. The computer program product 900 is tangibly embodied on a non-transitory computer readable storage medium that includes a recording medium 902, such as, a floppy disk, a high capacity read only memory in the form of an optically read compact disk or CD-ROM, a tape, or another similar computer program product. Recording medium 902 stores program means 904, 906, 908, and 910 on the medium 902 for carrying out the methods for implementing enhanced scan chain diagnostics via a bypass multiplexing structure, such as, the bypass multiplexing structure 100.

A sequence of program instructions or a logical assembly of one or more interrelated modules defined by the recorded program means 904, 906, 908, and 910, direct the system 100 for implementing enhanced scan chain diagnostics via the bypass multiplexing structure of the preferred embodiments.

While the present invention has been described with reference to the details of the embodiments of the invention shown in the drawing, these details are not intended to limit the scope of the invention as claimed in the appended claims.

What is claimed is:

1. A method for implementing enhanced scan chain diagnostics via a bypass multiplexing structure comprising:
   providing a scan chain;
   partitioning said scan chain into a plurality of separate partitioned chains with bypass multiplexers for implementing enhanced scan chain diagnostics; said bypass multiplexers having independent controls enabling scan data to be routed through multiple different independent scan paths;
   providing a processor, said processor performing the steps of
   routing scan data through a combination of said chain scan and said separate partitioned chains and acquiring information used for scan failure isolation, to enable pinpoint identification of stuck-at-zero (SA0) and stuck-at-one (SA1) faults in the scan chain including running full SA0 and SA1 scan tests;
   responsive to identifying a fail in the full scan results, running separate partitioned SA0 and SA1 scan tests for each of plurality of separate partitioned chains;
   responsive to identifying a fail in a respective separate portioned chains, running the full SA0 and SA1 scan tests, moving the fail to a passing scan path section;
   responsive to identifying a required failing partitioned chain scan bypass test, scanning a next passing partitioned chain results for a number of number of cycles to point to respective fail location.

2. The method as recited in claim 1 includes said processor performing the steps of running a full zero scan test and running a full one scan test.

3. The method as recited in claim 2 wherein said plurality of separate partitioned chains includes three separate partitioned chains and includes responsive to identifying a full scan fail, running a full zero scan test and running a full one scan test for each of said three separate partitioned chains.

4. The method as recited in claim 3 further includes responsive to identifying a scan fail for each of said three separate partitioned chains, preforming a triple fail analysis.

5. The method as recited in claim 3 further includes responsive to identifying a scan fail for two of said three separate partitioned chains, preforming a double fail analysis.

6. The method as recited in claim 3 further includes responsive to identifying a scan fail for one of said three separate partitioned chains, preforming a single fail analysis.

7. The method as recited in claim 3 further includes responsive to not identifying a scan fail for one of said three separate partitioned chains, preforming a full scan fail analysis.

* * * * *